United States Patent [19]

Kawabata

[11] Patent Number: 5,227,279
[45] Date of Patent: Jul. 13, 1993

[54] PHOTOSENSITIVE COMPOSITION

[75] Inventor: Masami Kawabata, Takatsuki, Japan

[73] Assignee: Nippon Paint Co., Ltd., Osaka, Japan

[21] Appl. No.: 856,861

[22] Filed: Mar. 24, 1992

Related U.S. Application Data

[63] Continuation of Ser. No. 491,422, Mar. 9, 1990, abandoned.

[30] Foreign Application Priority Data

Mar. 10, 1989 [JP] Japan .................................... 1-58188

[51] Int. Cl.⁵ .............................................. G03C 1/73
[52] U.S. Cl. ..................................... 430/281; 430/910; 522/102; 522/116; 522/120
[58] Field of Search ................. 430/281, 910; 522/102, 522/116, 120

[56] References Cited

U.S. PATENT DOCUMENTS 4,485,167 11/1984 Briney et al. ..................... 430/910
4,517,281 5/1985 Briney et al. ..................... 430/910

OTHER PUBLICATIONS

Derwent Abstracts, World Patents Index, File 351, Abstract of DE3825738.

Primary Examiner—Jack P. Brammer
Attorney, Agent, or Firm—Wenderoth, Lind & Ponack

[57] ABSTRACT

Disclosed is a polymer having a group represented by the following formula (I) or (II) in a side chain on a main chain consisting of carbon-carbon bonds:

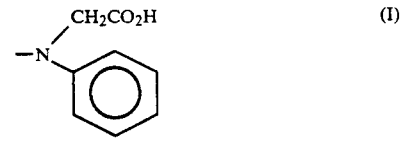

(I)

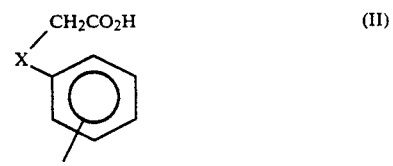

(II)

[wherein X is an oxygen atom, a sulfur atom or N—$R^1$, $R^1$ is a hydrogen atom, an alkyl group containing 1 to 3 carbon atoms or $CH_2CO_2H$], said group being decarboxylated by photo-reaction of its own or by photo-reaction with a photo-sensitizer which absorbs light to generate a free radical.

5 Claims, No Drawings

PHOTOSENSITIVE COMPOSITION

This application is a continuation of now abandoned application Ser. No. 07/491,422 filed Mar. 9, 1990, now abandoned.

FIELD OF THE INVENTION

The present invention relates to a photosensitive composition capable of optically forming an image, and a polymer used for the same.

BACKGROUND OF THE INVENTION

Negative type photosensitive compositions which utilize photo-initiated polymerization and photo-initiated cross-linking reaction have been widely used in various kinds of application, for example photoresist, ink and printing plates.

The negative type photosensitive compositions generally contain photopolymerizable polymers or oligomers which have acidic groups, such as carboxylic group, in the structure thereof. Since the acidic groups form salts by treating with an alkaline solution, non-exposed portions are dissolved away when treated with an alkaline solution, while exposed portions are polymerized by photo-initiated polymerization or photo-initiated cross-linking reaction and remain as they are without being dissolved away even though they form salts. However, in fact the exposed portions are slightly dissolved away due to the formation of a salt to "reduce a film-thickness". Such reduction of film-thickness is disadvantageous in respect of sensitivity and image dissolution.

SUMMARY OF THE INVENTION

It is an object of the present invention to solve the above described problem of the reduction of a film-thickness by an alkaline solution, thereby providing a negative type photosensitive composition having high sensitivity and high dissolution.

That is to say, the present invention provides a polymer having a group represented by the following formula (I) or (II) in a side chain on a main chain consisting of carbon-carbon bonds:

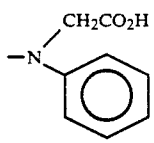
(I)

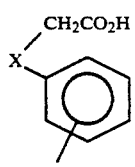
(II)

[wherein X is an oxygen atom, a sulfur atom or N—$R^1$, $R^1$ is a hydrogen atom, an alkyl group containing 1 to 3 carbon atoms or $CH_2CO_2H$] said group being decarboxylated by photo-reaction of its own or by photo-reaction with a photo-sensitizer which absorbs light to generate a free radical.

Since non-exposed portions of the photosensitive composition according to the present invention have carboxylic groups, they are dissolved away in the form of salts with an alkaline water. On the contrary, exposed portions lose carboxylic groups by photodecarboxylation and their solubility to the alkaline water is remarkably reduced by the polymerization reaction through free radicals generated at this time. Thus, the exposed portions are not dissolved away, whereby the reduction of film-thickness does not occur.

DETAILED DESCRIPTION OF THE INVENTION

The polymer (hereinafter referred to as a component A) according to the present invention includes polymers having the groups represented by the above described formula (I) or (II) as the free radical-generating portions, for example homopolymers of polymerizable compounds having these groups or copolymers of at least 2 kinds of such polymerizable compound or copolymers of these polymerizable compounds and other copolymerizable compounds. The polymerizable compounds having the groups represented by the formula (I) or (II) include

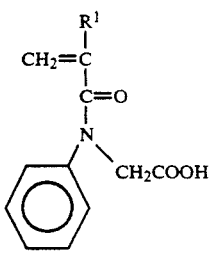

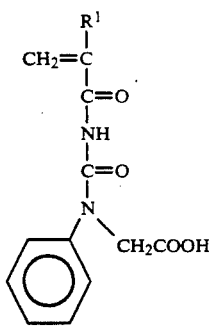

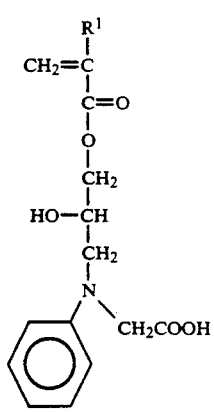

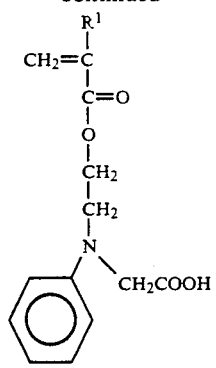

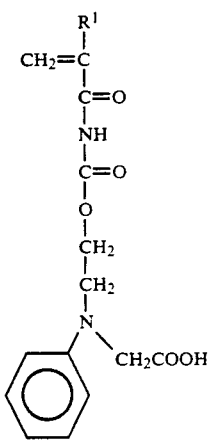

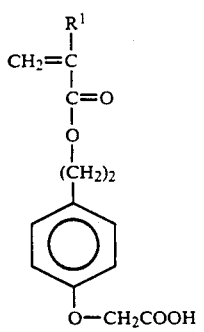

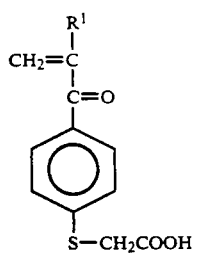

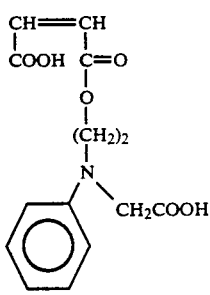

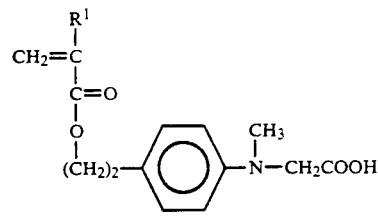

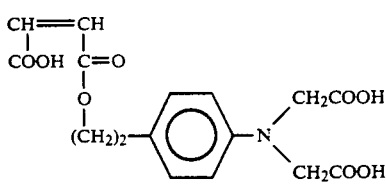

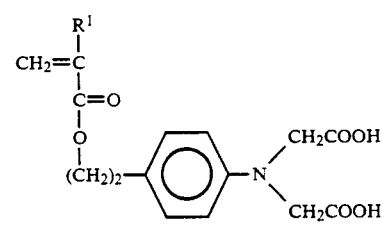

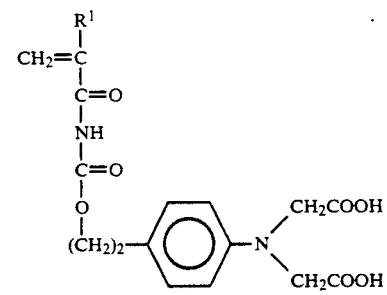

and the like (in the formula $R^1$ is a hydrogen or methyl group). Other copolymerizable compounds include acrylic acid, methacrylic acid, acrylic alkyl esters, methacrylic alkyl esters (containing a methyl-, ethyl-, n-propyl-, n-butyl-, iso-butyl-, 2-ethylhexyl group, and the like as the alkyl groups), benzyl acrylate, benzyl methacrylate, acrylonltrile, styrene, itaconic acid, maleic acid, maleic alkyl esters (containing alkyl groups having 1 to 5 carbon atoms), maleic anhydride, vinyl chloride, vinylidene chloride, butadiene, vinyl alcohol, vinyl acetate and the like.

Further, other polymers according to the present invention may be obtained by reaction between a certain polymer having a first reactive group, and a compound having a group reactive with the first reactive group and also having the groups represented by the above described formula (I) or (II). The groups reactive with each other include for example a carboxylic group and a hydroxyl group, a group having an activated hydrogen (e.g. a hydroxyl group) and an epoxy group and the like. As to the reaction between the carboxylic group and the hydroxyl group, it is preferable that a copolymer of styrene and maleic anhydride is used as the certain polymer and ˙N-phenyl-N-(2-hydroxyethyl)glycine is used as the compound having the above described reactive group and the groups represented by the formula (I) or (II).

In addition, the additional-polymerizable compounds (hereinafter referred to as a component B) having the ethylenically unsaturated double bonds used in the composition according to the present invention include unsaturated carboxylic acids, such as acrylic acid, methacrylic acid, itaconic acid and maleic acid; esters of the above described unsaturated carboxylic acids and polyhydroxylic compounds (e.g. ethylene glycol, tetraethylene glycol, neopentyl glycol, propylene glycol, 1,2-butane diol, trimethylol propane, pentaerythritol and tripentaerythritol); addition products of the above described unsaturated carboxylic acid and polyepoxides, (e.g. trimethylolpropane triglycidyl ether, pentaerythritol polyglycidyl ether, propylene glycol diglycidyl ether, a reaction product of epichlorhydrine with 2,2-bis(4-hydroxyphenyl)propane and diglycidyl ester of phthalic acid); and acrylamides and methacrylamides such as acrylamide, ethylene-bis-acrylamide, ethylene-bis-methacrylamide, hexamethylene-bis-acrylamide and hexamethylene-bis-methacrylamide. Acrylesters or methacrylesters are preferably used.

In addition, the photosensitive composition according to the present invention may contain a suitable the photosensitizer (hereinafter referred to as a component C) in order to increase photosensitive speed and widen photosensitive wavelength range. The photosensitizers include aromatic ketones, such as benzophenone, 2-ethyl anthraquinone and 2,4-diethylthiosantone; polycyclic aromatic hydrocarbons, such as anthrancene, phenanthrene and perylene; general dyes, such as coumarin type dyes, Rose Bengal and eosin, as disclosed in Japanese Kokai Publication 180946/1988; xanthene or thioxanthene type dyes as disclosed in Japanese Kokai Publication 31848/1987 and Japanese Patent Application Ser. No. 285017/1987; cyanine type dyes as disclosed in Japanese Patent Application Ser. No. 117187/1988; melocyanine type dyes as disclosed in Japanese Patent Application Ser. No. 113894/1987; and the like.

The component B is used in a quantity of 0 to 3 parts by weight, preferably 0.5 to 1.5 parts by weight, and the component C in a quantity of 0 to 0.2 parts by weight, preferably 0.05 to 0.15 parts by weight, based on 1 part by weight of the component A. If the component B is used in a quantity larger than 3 parts by weight, for example the hardness of the exposed portions is apt to be reduced on account of the remaining nonreacted component B. If the component C is used in a quantity larger than 0.2 parts by weight, the photopolymerization in the lower layer of the exposed portions is apt to be insufficient.

In order to further increase photosensitive speed, the photosensitive composition according to the present invention may contain diaryliodonium salts, for example chlorides, bromides, tetrafluoroborates, hexafluorophosphates, hexafluoroarsenates, hexafluoroantimonates and the like of iodoniums, (e.g. diphenyliodonium, bis(p-chlorophenyl)iodonium, ditryliodonium, bis(p-t-butylphenyl)iodonium and bis(m-nitrophenyl) iodonium); or peroxyesters, for example t-butylperoxybenzoate, di-t-butyldiperoxyisophthalate, 2,5-dimethyl -2,5-di(benzoylperoxy)hexane, t-butylperoxymaleic acid, 3,3',4,4'-tetra(t-butylperoxycarbonyl)benzophenone, t-butylperoxyisopropylcarbonate; and the like, if necessary. In addition, high-molecular binders, thermal polymerization inhibitors, plasticizers, coloring agents and the like may also be used as additives. The high molecular binders aim at the improvement of various kinds of property, such as compatibility, film-forming property, developing property and adhesion, and it is sufficient to variously select them depending upon the aims.

The composition according to the present invention may be prepared by the usual methods. For example, it can be prepared by mixing the above described essential components and optional component as they are or mixing with solvents (for example ketones, such as methyl ethyl ketone, acetone and cyclohexanone; esters, such as ethyl acetate, butyl acetate and ethylene glycol diacetate; aromatic solvents, such as toluene and xylene; cellosolves, such as methyl cellosolve, ethyl cellosolve and butyl cellosolve; alcohols, such as methanol, ethanol and propanol; ether, such as tetrahydrofurane and dioxane; and halogen containing solvents such as dichloromethane and chloroform) in for example a high-speed stirrer in a cool and dark place. The photosensitive layer of the present invention may be formed by applying said composition to the substrate by means of a bar coater or a spinner and then drying by usual methods. In addition, the known techniques for the protection of the surface and the prevention of bad influences, such as the reduction of sensitivity by oxygen, may be applied on the formed photosensitive layer. For example, the photosensitive layer may be coated with a separatable transparent cover sheet, waxy substances having a reduced permeability to oxygen, water-soluble or alkali-soluble polymers and the like.

Lasers, such as semiconductor laser, helium-neon laser, argon laser, helium-cadimium laser and krypton laser, and general light sources radiating visible rays and ultraviolet rays, such as superhigh voltage mercury-vapor lamp, high-voltage mercury-vapor lamp, middle-voltage mercury-vapor lamp, methal hydride lamp and tungsten lamp, can be used as the light source for making the above described photosensitive layer insoluble by radiating light. Besides, in order to remove the photosensitive layer of the nonexposed portions after the radiation of light, suitable solvents, for example a developer for use in an offset PS, capable of dissolving the photosensitive layer of the nonexposed portions may be used in addition to alkaline water such as an aqueous solution of sodium metasilicate, an aqueous solution of sodium carbonate, an aqueous solution of triethylamine, an aqueous solution of triethanolamine and an ammonia water.

Also, another image-forming method, in which a difference between a polarity of the nonexposed portions and a polarity of the exposed portions reduced by the removal of carbonic acid is utilized, can be used. That is to say, if a surface of the sample according to the present invention exposed through a positive film is treated with pigments and the like having a high polarity, the pigments are adsorbed or react upon mostly the nonexposed portions having a high polarity to obtain a positive image.

The photosensitive composition according to the present invention can be used for light-setting type paints, printing plates, resists for forming a print circuit, halogen, mather plates of hologram and the like.

The photosensitive composition according to the present invention does not reduce a film-thickness after the development in the exposed portions and exhibits high sensitivity and image-dissolution.

EXAMPLE

The present invention is illustrated by the following examples which, however, are not to be construed as limiting the invention to their details.

EXAMPLE 1

A sodium salt of N-phenylglycine of 50 g (0.29 mol) was dissolved in water of 50 g and methanol of 50 g and then hydroquinone of 18 mg were added to the resulting solution. This solution was heated up to temperatures of 45° to 50° C. and glycidyl methacrylate of 41 g (0.29 mol) was added dropwise for 20 minutes with stirring followed by stirring for further 2 hours. Water of 200 g was added to the resulting solution and acidified with hydrochloric acid followed by filtering and drying the resulting crystals. N-(2-hydroxy-3-methacryloxypropyl)-N-phenylglycine (hereinafter called GMA-NPG for short) of 45 g was obtained. Then GMA-NPG of 2.0 g, MMA (methyl methacrylate) of 14.0 g, EA (ethyl acrylate) of 2.4 g and MAA (methacrylic acid) of 1.6 g were dissolved in dimethylformamide of 80 g. 20 g of a 1 wt %-solution of benzoyl peroxide in dimethylformamide was added dropwise to the above described solution under an atmosphere of nitrogen at 70° C. followed by stirring for further 6 hours. After cooling, hexane of about 10 times in weight was added to dilute the solution, the resulting polymer being settled and collected, the collected polymer being dissolved in methalethylketone and settled again in hexane, and the settled material being fltered and dried in a vacuum. A white powdery polymer was obtained. The number mean molecular weight of the obtained polymer was 25,000 and its acid value was 75. In addition, it was confirmed from the existence of an absorption having a peak at 300 nm in the UV absorption spectrum of this polymer that GMA was copolymerized with NPG.

EXAMPLE 2

Monochloroacetic acid of 72 g (0.76 mol) was dissolved in water of 200 g and an aqueous solution containing sodium hydroxide of 32 g (0.8 mol) was added dropwise to the above described solution. The resulting solution was heated up to 100° C. and p-hydroxyphenethyl alcohol of 104.9 g (0.76 mol) was added to the heated solution dropwise for 30 minutes with stirring. Then, after stirring for further 90 minutes at 100° C. and cooling, the resulting white crystals [p-(2-hydroxyethyl)phenoxyacetic acid] were filtered and dried.

Subsequently, a copolymer of styrene and maleic anhydride (1:1) of 20 g, the above described p-(2-hydroxyethyl)phenoxyacetic acid of 3.2 g and tetra(n-butyl)ammonium chloride as a catalyst were dissolved in dehydrated dimethylformamide of 80 g and stirred for 3 hours at 120° C. followed by adding n-butyl alcohol of 100 g and stirring for 1 hour at 120° C. After cooling, methanol of about 10 times in weight was added to dilute the solution, thereby settling a polynmer, whcih was filtered and dried. A white powdery polymer was obtained. The number mean molecular weight of the obtained polymer was 32,000 and its acid value was 220.

In addition, it was confirmed from the existence of an absorption by a symmetrical expansion and contraction of C—O—C of p-(2-hydroxyethyl) phenoxyacetic acid in the vicinity of 1,040 cm$^{-1}$ in the infrared absorption spectrum of this polymer that p-(2-hydroxyethyl)-phenoxyacetic acid was subjected to an addition reaction.

EXAMPLE 3

20 g of GMA-NPG obtained according to Example 1 was dissolved in dimethylformamide of 80 g and a 2 wt %-solution of azo-bis-isobutylonitrile in dimetylformamide of 20 g was added to the above described solution dropwise at 70° C. under an atmosphere of nitrogen followed by stirring for further 6 hours. After cooling, hexane of about 10 times in weight was added to dilute the solution. The deposited polymer was filtered and dried in a vacuum. A white powdery polymer was obtained. The number mean molecular weight of the obtained polymer was 8,000 and its acid value was 190.

APPLICATION EXAMPLES

Photosensitive plates were produced by the use of photosensitive materials according to Examples and the conventional photosensitive material, and tested on the sensitivity and the reduction of film-thickness.

APPLICATION EXAMPLE 1

The polymer obtained according to Example 1 of 1 g was dissolved in methylethylketone of 10 g to obtain a photosensitive solution and the obtained photosensitive solution was applied to an aluminum substrate by means of a bar coater in a quantity of 2 g/m$^2$ when dried and dried for minutes at 60° C. in a desiccator. Additionally, an aqueous solution of polyvinyl alcohol (saponification degree 88%; polymerization degree: 500) was applied to this photosensitive layer by means of a bar coater to form a protective layer of 2 g/m$^2$. Subsequently, a negative film was overlapped on this photosensitive plate to be adhered closely to each other in a vacuum and irradiated with a light of a high-voltage mercury vapor lamp of 3 KW for 2 minutes from a distance of 60 cm followed by dissolving away nonexposed portions with a 1 wt %-aqueous solution of sodium carbonate and developing, with the result that a faithful and clear image could be obtained.

COMPARATIVE APPLICATION EXAMPLE 1

A photosensitive plate was produced and tested in quite the same manner as in Application Example 1 excepting that an acrylic polymer (MMA/EA/MMA=75/14/11; number mean molecular weight: 28,000; acid value:78) of 1 g and N-phenylglycine of 0.2 g were used in place of 1 g of the polymer obtained according to Example 1, with the result that no image could be obtained.

APPLICATION EXAMPLE 2

The polymer obtained according to Example 1 of 1 g, pentaerythritol triacrylate of 1 g and 2,4-diethylthioxantone of 0.03 g were dissolved in methylethylketone of 10 g and a photosensitive plate was produced in quite the same manner as in Application Example 1 by the use of the resulting photosensitive solution. This photosensitive plate was irradiated with a light of a high-voltage mercury vapor lamp of 3 KW for 30 seconds from a distance of 60 cm and then an exclusive brush of 1 kg weight was reciprocated 100 times on this photosensitive plate while adding a 1 wt %-aqueous solution of sodium carbonate drop by drop in a "Gardener abrasion tester AB-601" (manufactured by Kamishima Works, Ltd.). After washing and drying, the observation was visually conducted with the results that the irradiated photosensitive layer was glossy and no reduction of film-thickness was observed.

COMPARATIVE APPLICATION EXAMPLE 2

A photosensitive plate was produced and tested in quite the same manner as in Application Example 2 excepting that an acrylic polymer (same as in Comparative application Example 1) of 1 g and N-phenylglycine of 0.2 g were used in place of the polymer obtained according to Example 1. As a result, the irradiated photosensitive layer tested in the abrasion tester was not glossy at all in comparison with that in Application Example 2 and reduction of film-thickness was observed.

APPLICATION EXAMPLES 3 to 7, COMPARATIVE APPLICATION EXAMPLES 3 to 7

Photosensitive plates comprising photosensitive layers having the respective compositions shown in Table 1 were produced in the same manner as in Application Example 1. However, the photosensitizers and diphenyliodonium chloride were previously dispersed (partially dissolved) in methylcellosolve and then dissolved in methylethylketone.

A Step Tablet No. 2 (21 steps) manufactured by Eastman Kodak Corp. was put upon the above described photosensitive plates and irradiated with light having wavelength of about 490 nm (the intensity of light: 4.0 mW/cm$^2$) taken out through a filter Toshiba KL-49 from lights of a xenon lamp (150 W) manufactured by Ushio Electric Machinery Co., Ltd. for 30 seconds followed by developing with a 1 wt %-aqueous solution of sodium carbonate. "Sensitivity" was determined by calculating an exposure energy required for the hardening on the basis of a number of optically hardened steps. In addition, in order to investigate alkaline water resistance of the irradiated photosensitive layer of the respective photosensitive plates, the photosensitive plate, which had been directly irradiated with the above described lights having wavelengths of about 490 nm for 5 seconds without passing through the step tablet, was treated in the same manner as in Application Example 2 in the "Gardener abrasion tester AB-601" shown in Application Example 2 followed by visually observing the irradiated photosensitive layer to evaluate the "alkaline water resistance (that is the resistance to the reduction of film-thickness) of the irradiated layer". The results of "the sensitivity" and "the alkaline water resistance of the irradiated layer" are shown in Table 1. In addition, in Comparative Application Examples, composites using mixtures of usual polymers and the compounds bringing about the decarboxylation reaction by irradiation, without using the polymers having the portions bringing about the decarboxylation reaction by irradiation according to the present invention, were treated likewise. Also those results are shown in Table 1. The comparative Examples correspond to Examples numbered equally.

As obvious from the results shown in Table 1, the use of the polymers having the portions bringing about the decarboxylation reaction by irradiation according to the present invention leads to the obtainment of photosensitive composites having sensitivity and alkaline water resistance higher than those of photosensitive compositions using the mixtures of the usual polymers and the compounds bringing about the decarboxylation reaction by irradiation.

TABLE 1

| No. | Polymer | Additionally polymerizable compound | Photo-sensitizer | Other ingredients | Sensitivity[1] (mJ/cm$^2$) | Alkaline water resistance |
|---|---|---|---|---|---|---|
| EXAMPLE-3 | A-1[2] (100) | — | C-1[9] (6) | D-1[12] (50) | 1.2 | slightly good |
| EXAMPLE-4 | A-1 (100) | B[8] (100) | C-1 (6) | — | 0.1 | good |
| EXAMPLE-5 | A-1 (100) | B (100) | C-2[10] (6) | — | 0.2 | good |
| EXAMPLE-6 | A-2[3] (60) | B (100) | C-2 (6) | D-2[13] (2), D-3[14] (40) | 0.1 | good |
| EXAMPLE-7 | A-3[4] (50) | B (100) | C-3[11] (6) | D-2 (2), D-3 (50) | 0.4 | good |
| COMPARATIVE EXAMPLE-3 | A-4[5] (100) | — | C-1 (6) | D-1 (50), D-4[15] (8) | >120 (not hardened) | (no film is left) |
| COMPARATIVE EXAMPLE-4 | A-4 (100) | B (100) | C-1 (6) | D-4 (8) | 1.2 | not good |
| COMPARATIVE EXAMPLE-5 | A-4 (100) | B (100) | C-2 (6) | D-5 (8) | 1.8 | not good |
| COMPARATIVE Example 6 | A-5[6] (60) | B (100) | C-2 (6) | D-2 (2), D-3 (40), D-4 (8) | 1.2 | not good |
| COMPARATIVE | A-6[7] (50) | B (100) | C-3 (6) | D-2 (2), D-3 (50), D-4 (8) | 1.8 | not good |

TABLE 1-continued

| | Photosensitive composition (ratio by weight) | | | | Sensitivity[1] (mJ/cm$^2$) | Alkaline water resistance |
|---|---|---|---|---|---|---|
| No. | Polymer | Additionally polymerizable compound | Photo-sensitizer | Other ingredients | | |
| EXAMPLE-7 | | | | | | |

[1] The smaller the numerical value is, the higher the sensitivity is.
[2] The polymer obtained according to Example 1.
[3] The polymer obtained according to Example 2.
[4] The polymer obtained according to Example 3.
[5] Acrylic polymer (composition: MMA/EA/MAA = 75/14/11; number mean molecular weight: 28,000, acid value: 78)
[6] N-butyl alcohol half ester of a copolymer of sytrene and maleic anhydride number mean molecular weight: 30,000; acid value: 210)
[7] N-butyl alcohol half ester of a copolymer of sytrene and maleic anhydride number mean molecular weight: 9,000; acid value: 212)
[8] Pentaerythritol triacrylate
[9]

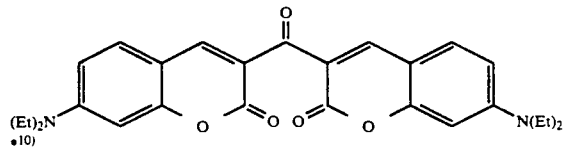

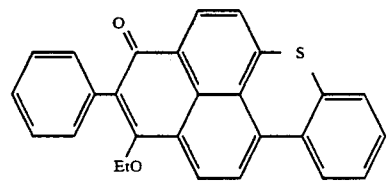

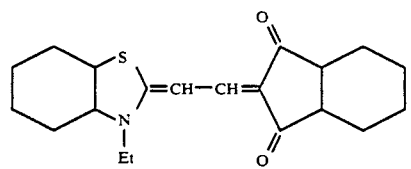

[12] Dioctyl phthalate (plasticizer)
[13] Diphenyliodonium chloride
[14] Acrylic polymer (trade name BR-77 manufactured by Mitsubishi Rayon Co., Ltd.)
[15] N-phenylglycine

What is claimed is:

1. A photosensitive composition consisting essentially of:
   1 part by weight of a polymer which is a homopolymer or copolymer of a monomer represented by the formula

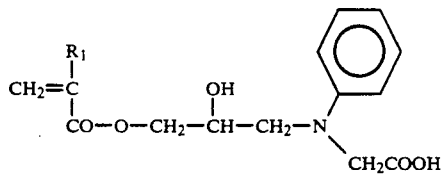

wherein $R_1$ is a hydrogen atom or a methyl group, and 0.5 to 3 parts by weight of a compound having an ethylenically unsaturated double bond selected from the group consisting of an unsaturated carboxylic acid, an ester of the unsaturated carboxylic acid, an addition product of the unsaturated carboxylic acid and a polyepoxide, a (meth)acrylamide and a mixture thereof.

2. The composition according to claim 1, wherein said polymer is a copolymer of said monomer and another copolymerizable compound.

3. The composition according to claim 1, further consisting essentially of a photosensitizing amount of a photosensitizer.

4. The composition according to claim 1, further consisting essentially of photosensitizing amount of a photosensitizer, and a diaryliodonium salt in an amount effective to increase photosensitive speed.

5. The composition according to claim 2, further consisting essentially of a photosensitizing amount of a photosensitizer, and a peroxyester in an amount effective to increase photosensitive speed.

* * * * *